(12) United States Patent
Pohlmann et al.

(10) Patent No.: US 12,164,791 B2
(45) Date of Patent: Dec. 10, 2024

(54) INITIALIZING MEMORY SYSTEMS

(71) Applicant: Micron Technology, Inc., Boise, ID (US)

(72) Inventors: Erik V. Pohlmann, Boise, ID (US); Scott Schlachter, San Jose, CA (US); Won Ho Choi, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/812,646

(22) Filed: Jul. 14, 2022

(65) Prior Publication Data

US 2023/0025601 A1     Jan. 26, 2023

Related U.S. Application Data

(60) Provisional application No. 63/225,200, filed on Jul. 23, 2021.

(51) Int. Cl.
| | | |
|---|---|---|
| *G06F 13/16* | (2006.01) | |
| *G06F 3/06* | (2006.01) | |
| *G11C 11/4093* | (2006.01) | |

(52) U.S. Cl.
CPC .......... *G06F 3/0632* (2013.01); *G06F 3/0604* (2013.01); *G06F 3/0656* (2013.01); *G06F 3/0673* (2013.01); *G06F 13/1673* (2013.01); *G06F 13/1689* (2013.01); *G11C 11/4093* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 9,860,088 B1 * | 1/2018 | DeSimone | .......... G11C 11/4093 |
| 11,886,702 B2 * | 1/2024 | Pohlmann | ............. G06F 3/0688 |

(Continued)

FOREIGN PATENT DOCUMENTS

| | | | | |
|---|---|---|---|---|
| DE | 102010052726 A1 * | 5/2012 | ........... H04L 41/082 |
| KR | 20210033593 A * | 3/2021 | ............. G11C 7/222 |
| WO | 2015/095832 A1 | 6/2015 | |

OTHER PUBLICATIONS

Translation of DE-102010052726-A1. 2023.*

(Continued)

*Primary Examiner* — Nathan Sadler
(74) *Attorney, Agent, or Firm* — Holland & Hart LLP

(57) ABSTRACT

Methods, systems, and devices for initializing memory systems are described. A memory system may transmit, to a host system over a first channel, signaling indicative of a first set of values for a set of parameters associated with communicating information over a second channel between a storage device of the memory system and a memory device of the memory system. The host system may transmit, to the memory system, additional signaling associated with the first set of values for the set of parameters. For instance, the host system may transmit a second set of values for the set of parameters, an acknowledgement to use the first set of values, or a command to perform a training operation on the second channel to identify a second set of values for the set of parameters. The memory system may communicate the information over the second channel based on the additional signaling.

35 Claims, 7 Drawing Sheets

(56) References Cited

U.S. PATENT DOCUMENTS

| | | | |
|---|---|---|---|
| 2006/0117155 A1* | 6/2006 | Ware | G06F 3/0673 |
| | | | 711/163 |
| 2008/0130343 A1* | 6/2008 | Janzen | G11C 7/04 |
| | | | 365/51 |
| 2010/0070690 A1* | 3/2010 | Amer | G06F 3/0611 |
| | | | 711/E12.001 |
| 2012/0191964 A1* | 7/2012 | Lee | G06F 11/2289 |
| | | | 713/2 |
| 2015/0294698 A1* | 10/2015 | Takefman | G11C 7/1078 |
| | | | 365/189.05 |
| 2016/0011802 A1* | 1/2016 | Berke | G06F 3/0619 |
| | | | 711/166 |
| 2016/0291985 A1* | 10/2016 | Jenkins | G06F 3/0625 |
| 2018/0136866 A1* | 5/2018 | Eugenio | G06F 11/22 |
| 2020/0076652 A1* | 3/2020 | Shi | G06F 13/1689 |
| 2020/0151040 A1 | 5/2020 | Lee et al. | |
| 2020/0233741 A1 | 7/2020 | Brox et al. | |
| 2021/0073070 A1 | 3/2021 | Parry et al. | |
| 2021/0191631 A1 | 6/2021 | Gans | |
| 2021/0349730 A1* | 11/2021 | Lee | G06F 11/2284 |
| 2022/0244860 A1* | 8/2022 | Pohlmann | G06F 3/0655 |
| 2024/0126434 A1* | 4/2024 | Pohlmann | G06F 3/0688 |

OTHER PUBLICATIONS

Translation of KR-20210033593-A. 2023.*
"International Search Report and Written Opinion of the International Searching Authority," issued in connection with Int'l Appl. No. PCT/US2022/073783 dated Nov. 2, 2022 (11 pages).

* cited by examiner

INITIALIZING MEMORY SYSTEMS

CROSS REFERENCE

The present application for patent claims the benefit of U.S. Provisional Patent Application No. 63/225,200 by POHLMANN et al., entitled "INITIALIZING MEMORY SYSTEMS," filed Jul. 23, 2021, assigned to the assignee hereof, and expressly incorporated by reference herein.

FIELD OF TECHNOLOGY

The following relates generally to one or more systems for memory and more specifically to initializing memory systems.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A host system may be coupled with a memory system, such as a dual-inline memory module (DIMM). As part of initializing a system that includes the host system and the memory system, one or more communication channels may be trained between the host system and the memory system and/or within the memory system in order to identify settings to use to transmit signals over the communication channels. The training may occur at initialization and the results of the training may be used for communication after initialization. In some examples, channels between the host system and an interface of the memory system may be trained at initialization as well as communication channels between the interface of the memory system and one or more memory devices (e.g., at least one dynamic random access memory (DRAM)) of the memory system. In some examples, it may be desirable to train the communication channels between the interface and the one or more memory devices before the host system is coupled with the memory system (e.g., during the manufacturing of the memory system).

Techniques are provided that enable training for the channels between the interface and the one or more memory devices to occur prior to coupling the host system with the memory system. Techniques are also provided for communicating values resulting from the training to the host system when the host system is coupled with the memory system and the system is initialized. The memory system may store the values resulting from the training in a first storage device of the memory system, such as a serial presence detect (SPD) memory device of the memory system. The host system may identify the values resulting from the training and may transmit signaling to the memory system. The signaling may indicate to initiate a training operation that uses the values resulting from the training; may indicate that the host system is to use the values resulting from the training; or may override the values resulting from the training with values indicated via the signaling.

Features of the disclosure are initially described in the context of systems as described with reference to FIGS. 1 and 2. Features of the disclosure are described in the context of a process flow as described with reference to FIG. 3. These and other features of the disclosure are further illustrated by and described with reference to apparatus diagrams and flowcharts that relate to initializing memory systems as described with reference to FIGS. 4-7.

Figure 1:
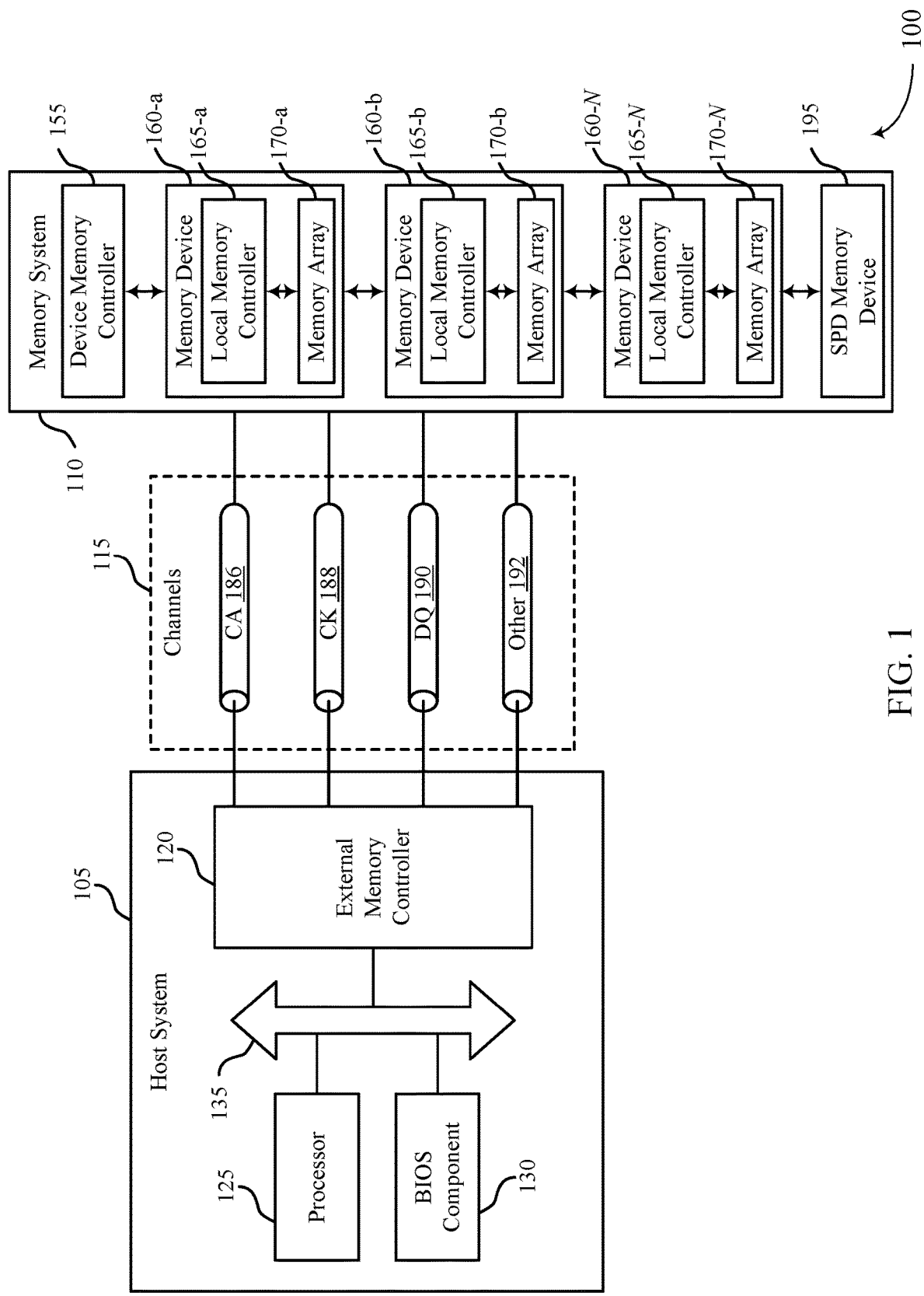
FIG. 1 illustrates an example of a system that supports initializing memory systems in accordance with examples as disclosed herein.

FIG. 1 illustrates an example of a system 100 that supports initializing memory systems in accordance with examples as disclosed herein. The system 100 may include a host system 105, a memory system 110, and a plurality of channels 115 coupling the host system 105 with the memory system 110. The system 100 may include one or more memory systems 110, but aspects of the one or more memory systems 110 may be described in the context of a single memory device (e.g., memory system 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory system 110 may be a component of the system operable to store data for one or more other components of the system 100.

At least portions of the system 100 may be examples of the host system 105. The host system 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host system 105 may refer to the hardware, firmware, software, or a combination thereof that implements the functions of an external memory controller 120. In some examples, the external memory controller 120 may be referred to as a host or a host system 105.

A memory system 110 may be an independent device or a component that is operable to provide physical memory addresses/space that may be used or referenced by the system 100. In some examples, a memory system 110 may be configurable to work with one or more different types of host devices. Signaling between the host system 105 and the memory system 110 may be operable to support one or more of: modulation schemes to modulate the signals, various pin configurations for communicating the signals, various form factors for physical packaging of the host system 105 and the memory system 110, clock signaling and synchronization between the host system 105 and the memory system 110, timing conventions, or other factors. In some examples, the memory system 110 may be an example of a DIMM.

The memory system 110 may be operable to store data for the components of the host system 105. In some examples, the memory system 110 may act as a secondary-type or dependent-type device to the host system 105 (e.g., responding to and executing commands provided by the host system 105 through the external memory controller 120). Such commands may include one or more of a write command for a write operation, a read command for a read operation, a refresh command for a refresh operation, or other commands.

The host system 105 may include one or more of an external memory controller 120, a processor 125, a basic input/output system (BIOS) component 130, or other components such as one or more peripheral components or one or more input/output controllers. The components of the host system 105 may be coupled with one another using a bus 135.

The processor 125 may be operable to provide control or other functionality for at least portions of the system 100 or at least portions of the host system 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105. The BIOS component 130 may include a program or software stored in one or more of read-only memory (ROM), flash memory, or other non-volatile memory.

The memory system 110 may include a device memory controller 155 and one or more memory devices 160 (e.g., memory chips) to support a desired capacity or a specified capacity for data storage. Each memory device 160 (e.g., memory device 160-a, memory device 160-b, memory device 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory system 110 including two or more memory devices 160 may be referred to as a multi-die memory or a multi-die package or a multi-chip memory or a multi-chip package. In some examples, each of the one or more memory devices 160 may be an example of a DRAM within a DIMM.

The device memory controller 155 may include circuits, logic, or components operable to control operation of the memory system 110. The device memory controller 155 may include the hardware, the firmware, or the instructions that enable the memory system 110 to perform various operations and may be operable to receive, transmit, or execute commands, data, or control information related to the components of the memory system 110. The device memory controller 155 may be operable to communicate with one or more of the external memory controller 120, the one or more memory devices 160, or the processor 125. In some examples, the device memory controller 155 may control operation of the memory system 110 described herein in conjunction with the local memory controller 165 of the memory device 160.

A local memory controller 165 (e.g., local to a memory device 160) may include circuits, logic, or components operable to control operation of the memory device 160. In some examples, a local memory controller 165 may be operable to communicate (e.g., receive or transmit data or commands or both) with the device memory controller 155. In some examples, a memory system 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host system 105 (e.g., the processor 125) and the memory system 110. The external memory controller 120 may convert or translate communications exchanged between the components of the host system 105 and the memory system 110. In some examples, the external memory controller 120 or other component of the system 100 or the host system 105, or its functions described herein, may be implemented by the processor 125. For example, the external memory controller 120 may be hardware, firmware, or software, or some combination thereof implemented by the processor 125 or other component of the system 100 or the host system 105. Although the external memory controller 120 is depicted as being external to the memory system 110, in some examples, the external memory controller 120, or its functions described herein, may be implemented by one or more components of a memory system 110 (e.g., a device memory controller 155, a local memory controller 165) or vice versa.

The components of the host system 105 may exchange information with the memory system 110 using one or more channels 115. The channels 115 may be operable to support communications between the external memory controller 120 and the memory system 110. Each channel 115 may be examples of transmission mediums that carry information between the host system 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host system 105 and one or more pins or pads at the memory system 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host system 105 and the memory system 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host system 105 and the memory system 110. For example, the data channels 190 may communicate information (e.g., bi-directional) to be written to the memory system 110 or information read from the memory system 110.

A host system 105 may be coupled with the memory system 110 to form a system. As part of initializing a system that includes the host system and the memory system, one or more communication channels between the host system 105 and the memory system 110 and/or one or more communication channels within the memory system 110 may be trained in order to identify settings to use transmit signals over the communication channels. The training may occur at initialization and the results of the training may be used for communication after initialization. In some examples, channels between the host system 105 and an interface of the memory system 110 may be trained as well as communication channels between the interface and the one or more memory devices 160 of the memory system 110. In some examples, it may be desirable to train the communication channels between the interface and the one or more memory devices 160 before the host system 105 is coupled with the memory system 110 (e.g., during the manufacturing of the memory system 110).

Techniques are provided that enable training for the channels between the interface and the one or more memory devices 160 to occur prior to coupling the host system 105 with the memory system 110 and for communicating values resulting from the training to the host system 105 in response to the host system 105 being coupled with the memory system 110. The memory system 110 may store the values resulting from the training in a first storage device of the memory system 110, such as a serial presence detect (SPD) memory device 195 (e.g., an electrically-erasable programmable read-only memory (EEPROM)) of the memory system 110. The host system 105 may identify the values resulting from the training and may transmit signaling to the memory system 110. The signaling may indicate to initiate a training operation that uses the values resulting from the training; may indicate that the host system 105 is to use the values resulting from the training; or may override the values resulting from the training with values indicated via the signaling.

Figure 2:
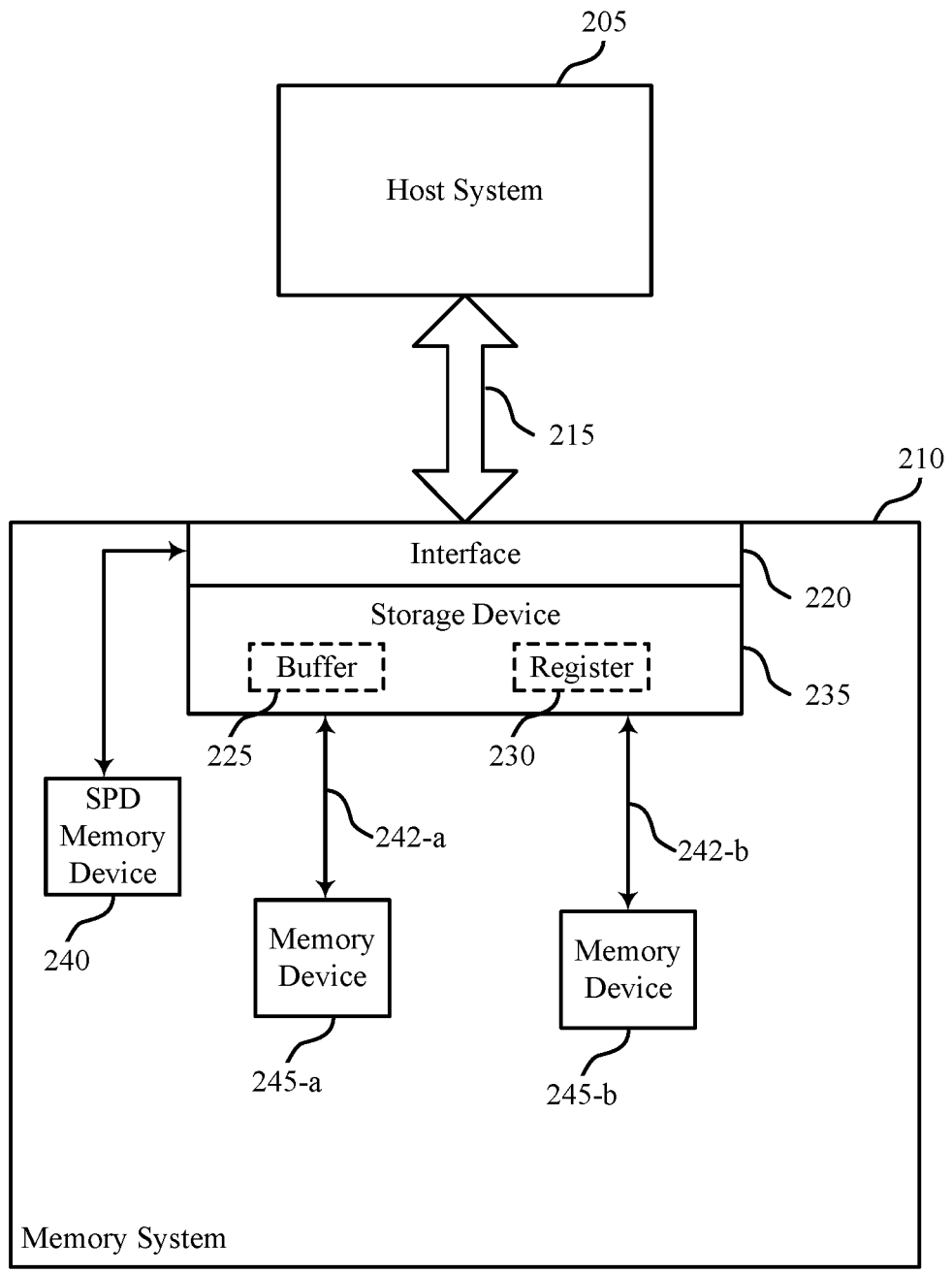
FIG. 2 illustrates an example of a system that supports initializing memory systems in accordance with examples as disclosed herein.

FIG. 2 illustrates an example of a system 200 that supports initializing memory systems in accordance with examples as disclosed herein. In some examples system 200 may implement one or more aspects of system 100. For instance, host system 205 may be an example of one or more aspects of host system 105 as described with reference to FIG. 1; memory system 210 may be an example of one or more aspects of memory system 110 as described with reference to FIG. 1 (e.g., a CA channel 186, a data channel 190, or both as described with reference to FIG. 1); first channel 215 may be an example of one or more aspects of channels 115 as described with reference to FIG. 1; and memory devices 245-*a* and 245-*b* may be examples of one or more aspects of a memory device 160 (e.g., memory device 160-*a*, memory device 160-*b*) as described with reference to FIG. 1.

Host system 205 may be coupled with memory system 210 via first channels 215. The first channels 215 may include data channels, command address channels, error control information channels, clock channels, other types of channels, or any combination thereof. Memory system 210 may include an interface 220, a storage device 235, an SPD memory device 240, and memory devices 245-*a* and 245-*b*. Storage device 235 may include a buffer 225, a register 230, or both. In some examples, buffer 225 may be coupled with one or more data pins of the interface 220 and register 230 may be coupled with one or more command pins (e.g., command/address pins) of the interface 220. Interface 220 may be coupled with SPD memory device 240, storage device 235, and host system 205 (e.g., via first channel 215). Storage device 235 may be coupled with memory devices 245-*a* and 245-*b* (e.g., via second channels 242-*a* and 242-*b*, respectively).

Interface 220 may be configured to receive commands and data from host system 205. Additionally, interface 220 may be configured to receive or transmit data between the host system 205 and the memory system 210. Storage device 235 may be configured to store commands received at interface 220 at one or more registers (e.g., a register 230, such as a register clock driver (RCD)) and/or may be configured to store data at one or more buffers (e.g., a buffer 225). Additionally, storage device 235 may be configured to store data received from memory devices 245-a and/or 245-b at one or more buffers (e.g., a buffer 225) and to provide the data to interface 220. As such, the storage device 235 may facilitate communication between the host system 205 and the memory system 210 by buffering information received from the host system 205 and information to be transmitted to the host system 205. SPD memory device 240 may be configured to store a first set of values for a set of parameters associated with communicating information via second channels 242-a and/or 242-b (e.g., between storage device 235 and memory devices 245-a and/or 245-b). In some examples, interface 220 may include or may be an example of one or more pins. In some examples, buffer 225 may be coupled with each of memory devices 245-a and 245-b via a respective data pin of second channels 242-a and 242-b and register 230 may be coupled with each of memory devices 245-a and 245-b via a respective C/A pin of second channels 242-a and 242-b.

In some examples, the host system 205 may be coupled with the memory system 210. In some such examples, one or more communication channels between the host system 205 and the memory system 210 (e.g., first channel 215) and/or one or more communication channels within the memory system 210 (e.g., second channels 242-a and 242-b) may be trained in order to identify settings to use transmit signals over the communication channels. The training may occur at initialization (e.g., a configuration procedure associated with powering the memory system) and the results of the training may be used for communication after initialization. In some examples, as part of the initialization process after the host system 205 is coupled with the memory system 210, the communication channels between the host system 205 and the interface 220 (e.g., first channel 215) may be trained as well as the second channels 242 (e.g., 242-a and 242-b) between the storage device 235 coupled with the interface 220 and the one or more memory devices 245 (e.g., 245-a and 245-b) of the memory system 210 may be trained. In some examples, it may be desirable to train the second channels 242-a and 242-b before the host system 205 is coupled with the memory system 210 (e.g., during the manufacturing of the memory system 210).

Techniques are provided that enable training for the second channels 242-a and 242-b to occur prior to the host system 205 being coupled with the memory system 210 and for communicating values of parameters resulting from the training to the host system 205 in response to the host system 205 being coupled with the memory system 210. The memory system 210 may store the values resulting from the training in SPD memory device 240 (e.g., an SPD EEPROM). The memory system 210 may transmit signaling indicating the values resulting from the training to the host system 205 and the host system 205 may identify the values resulting from the training.

The host system 205 may transmit additional signaling to the memory system 110. For instance, the host system 205 may transmit updated values of the parameters for second channels 242. Additionally or alternatively, the host system 205 may transmit an acknowledgement to use the values received by the host system 205 for the second channels 242. Additionally or alternatively, the host system 205 may transmit a command to perform a training operation on the second channels 242 to identify updated values for the parameters, in which case the memory system 210 may identify the updated values based on receiving the command. In some examples, host system 205 may transmit another command to perform another training operation on first channel 215 to identify values for parameters of first channel 215. In some such examples, the other training operation for first channel 215 may be different than the training operation for the second channels 242. In some such examples, the values of the parameters for the second training operation for first channel 215 may be used as starting values for the training operation for the second channels 242.

In some examples, the parameters of the second channels 242 may include a gain associated with a decision feedback equalization (DFE) of some or each second channel 242. Additionally or alternatively, the parameters of the second channels 242 may include an indication of whether one or more taps of the DFE for some or each second channel 242 are enabled. Additionally or alternatively, the parameters of the second channels 242 may include an indication of whether the DFE for some or each second channel 242 is enabled. Additionally or alternatively, the parameters may include a reference voltage of some receivers associated with the second channels 242. Additionally or alternatively, the parameters may include an adjustment parameter for the reference voltage for some receivers associated with the second channels 242. Additionally or alternatively, the parameters may include an indication of whether on-die termination (ODT) of some drivers or receivers associated with the second channels 242 are enabled. Additionally or alternatively, the parameters may include an indication of whether duty cycle adjusting (DCA) for some drivers or receivers associated with the second channels 242 are enabled. Additionally or alternatively, the parameters may include a DCA adjustment parameter associated with one or more clock signals (e.g., signals sent via channel 188 as described with reference to FIG. 1).

In some examples, the methods and apparatuses described herein may be associated with one or more potential advantages. For instance, performing training for the second channels 242 at the memory system 210 prior to coupling the memory system 210 with the host system 205 may enable the host system 205 to spend less time performing training for the second channels 242. For instance, the host system 205 may refrain from performing the training once the host system 205 receives the signaling indicating the value of the parameters or may perform training for a shorter duration relative to training in which the host system 205 has not received the values. Performing training for a shorter duration may decrease latency associated initialization and may, accordingly, increase the efficiency of communications between memory system 210 and host system 205. In some examples, the methods and apparatuses described herein may reduce time associated with a host memory controller (e.g., a controller of host system 205) initializing and training an interface 220 following each power-up or reset event.

Figure 3:
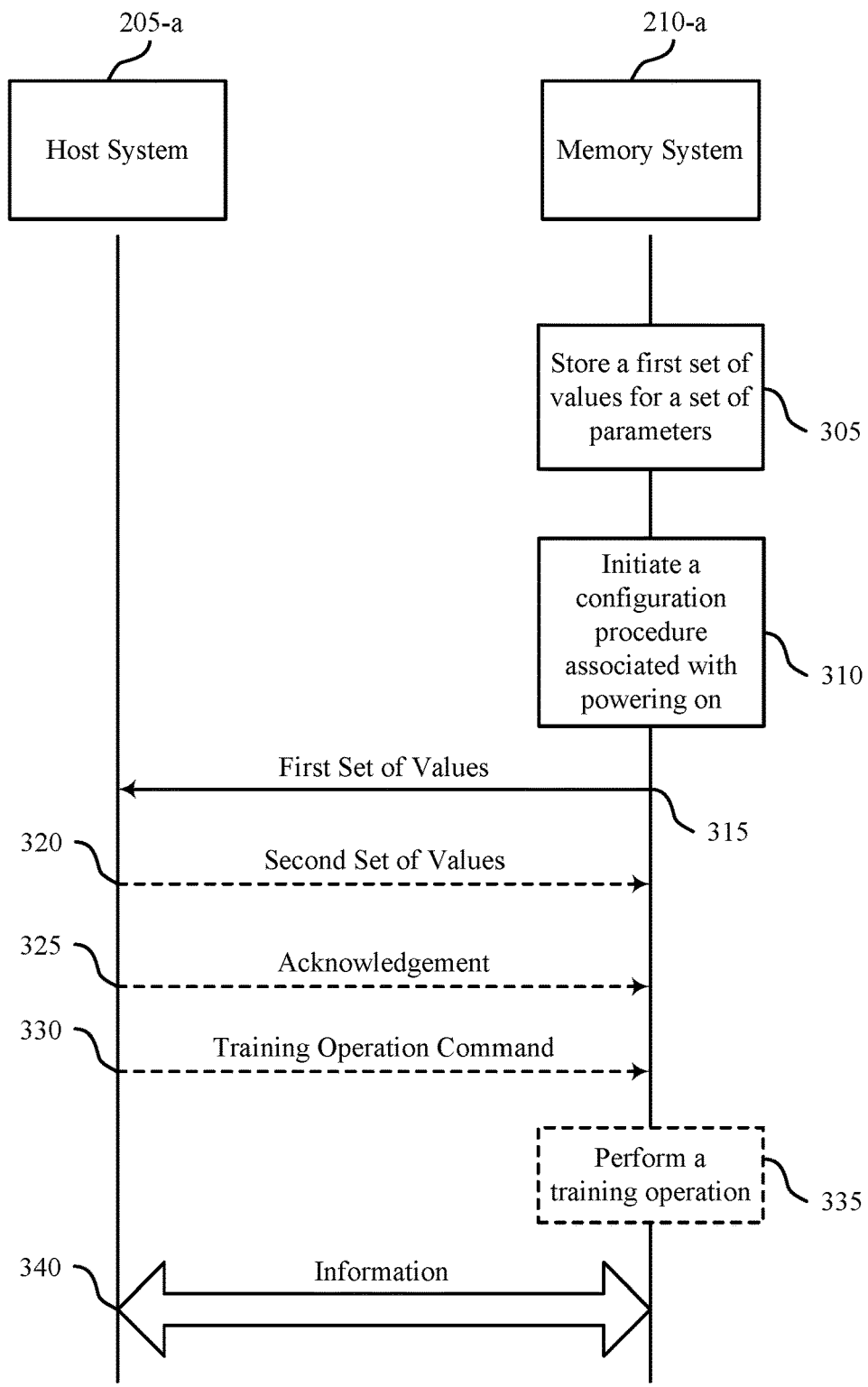
FIG. 3 illustrates an example of a process flow that supports initializing memory systems in accordance with examples as disclosed herein.

FIG. 3 illustrates an example of a process flow 300 that supports initializing memory systems in accordance with examples as disclosed herein. In some examples, process flow 300 may implement one or more aspects of systems 100 and/or 200. For instance, host system 205-a may be an example of a host system 105 as described with reference to FIG. 1 or a host system 205 as described with reference to FIG. 2 and memory system 210-a may be an example of a memory system 110 as described with reference to FIG. 1 or a memory system 210 as described with reference to FIG. 2.

At 305, memory system 210-a may store a first set of values for a set of parameters. For instance, memory system 210-a may perform training on one or more second channels (e.g., second channels 242-a and 242-b as described with reference to FIG. 2) between a storage device of memory system 210-a and one or more memory devices (e.g., volatile memory devices, such as DRAM memory devices) of memory system 210-a, may determine the first set of values based on the training, and may store the first set of values at an SPD memory device of memory system 210-a (e.g., an SPD EEPROM). In some examples, the set of parameters may include a gain associated with DFE of the one or more second channels, an indication of whether one or more taps of the DFE of the one or more second channels are enabled, an indication of whether the DFE for the one or more second channels is enabled, a reference voltage of the one or more second channels, an adjustment parameter for the reference voltage of the one or more second channels, an indication of whether ODT of the one or more second channels is enabled, an indication of whether DCA for the second channel is enabled, a DCA parameter associated with one or more clock signals, or any combination thereof.

At 310, memory system 210-a may initiate a configuration procedure associated with powering on (e.g., memory system 210-a may initialize). The configuration procedure may be associated with initializing the memory system after the memory system 210-a has been coupled with the host system 205-a.

At 315, memory system 210-a may transmit, to host system 205-a, signaling indicative of the first set of values for the set of parameters. For instance, memory system 210-a may retrieve the first set of values from the SPD memory device and may transmit signaling indicative of the first set of values via an interface (e.g., an interface 220 as described with reference to FIG. 2) of the memory system 210-a. In some examples, the set of parameters may be associated with communicating information over the second channel between the storage device and a memory device of the one or more memory devices, where the storage device is configurated to buffer the information communicated between host system 205-a and memory system 210-a (e.g., via a first channel, such as a first channel 215 as described with reference to FIG. 2).

At 320, host system 205-a may (optionally) transmit, to memory system 210-a, a second set of values for the set of parameters for the one or more second channels based on receiving the signaling indicative of the first set of values. The host system 205-a may transmit the second set of values if the host system 205-a is going to use different values for the second channels other than the first set of values.

At 325, host system 205-a may transmit, to memory system 210-a, an acknowledgement to use the first set of values for the set of parameters for the one or more second channels based on receiving the signaling indicative of the first set of values. The host system 205-a may transmit the acknowledgement if the host system 205-a is going to use the first set of values for the second channels.

At 330, host system 205-a may transmit, to memory system 210-a, a command to perform a training operation on the second channel to identify a second set of values for the set of parameters. The host system 205-a may transmit the command to perform the training operation if the host system 205-a is going to do additional training on the second channels in addition to the training that occurred before the memory system 210-a and the host system 205-a was coupled together.

At 335, memory system 210-a may identify a third set of values for the set of parameters of the one or more second channels based on performing a training operation. In some examples, host system 205-a may transmit, to memory system 210-a, a second command to perform a second training operation on the first channel to identify a set of values for a second set of parameters for the first channel. In some such examples, the second training operation for the first channel may be different that the training operation for the one or more second channels. In some cases, the initial values used by the training operation may be the first set of values stored in the memory device.

At 340, host system 205-a and memory system 210-a may communicate the information over the one or more first channels based on performing the training operation for the first channels. The memory system 210-a may communicate the information between its interface and the memory devices in the memory system over the second channels using the first set of values, the second set of values, or the third set of values for the second channels.

In some examples, the memory system may include a DIMM, the memory device may include a volatile memory device of the DIMM (e.g., DRAM), and the storage device may include a buffer, a register, or both. Additionally, the one or more second channels may each include a CA pin and a data pin, where a first portion of the storage device is coupled with CA pin includes a register and a second portion of the storage device coupled with the data pin includes a buffer.

Figure 4:
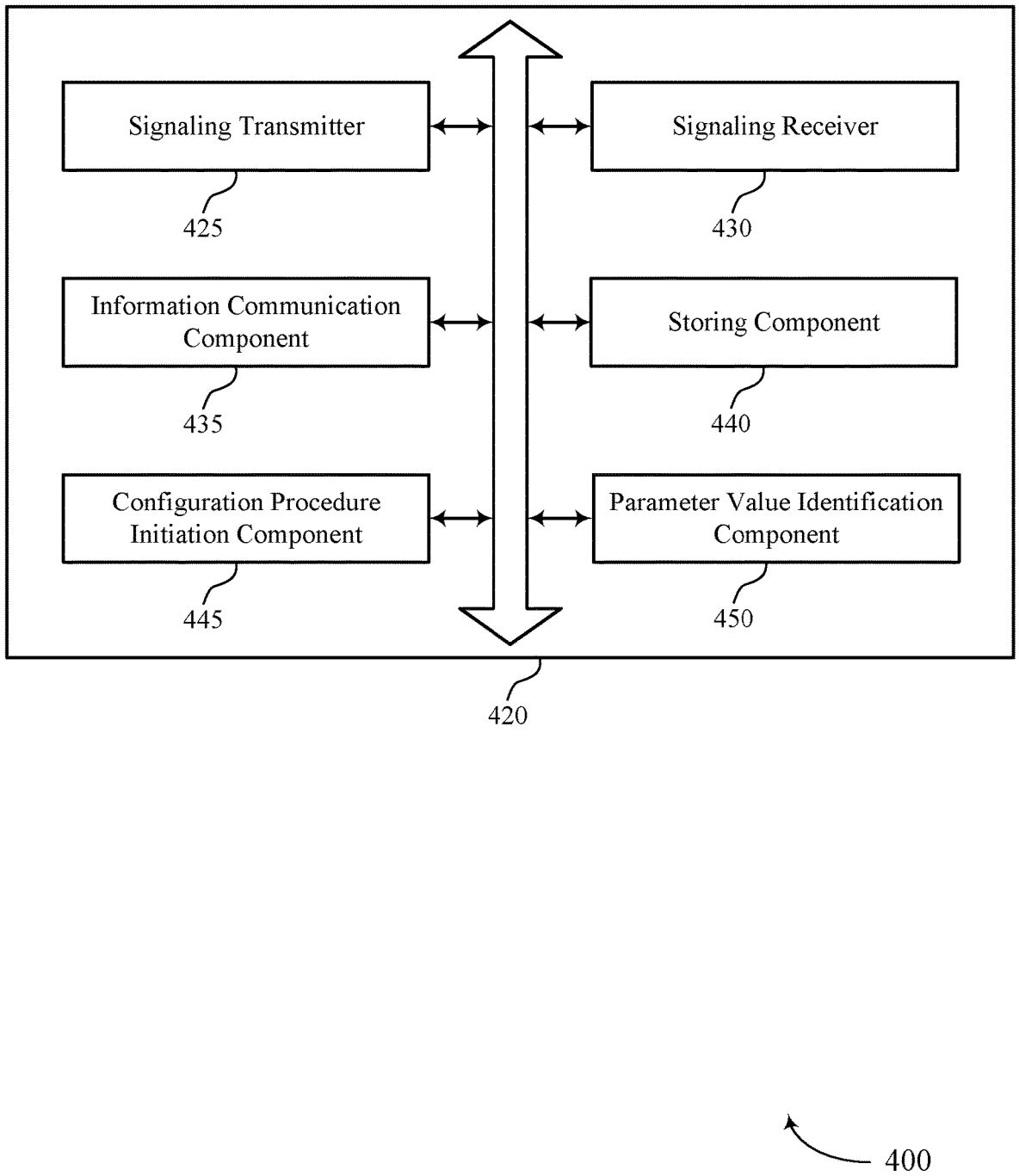
FIG. 4 shows a block diagram of a memory system that supports initializing memory systems in accordance with examples as disclosed herein.

FIG. 4 shows a block diagram 400 of a memory system 420 that supports initializing memory systems in accordance with examples as disclosed herein. The memory system 420 may be an example of aspects of a memory system as described with reference to FIGS. 1 through 3. The memory system 420, or various components thereof, may be an example of means for performing various aspects of initializing memory systems as described herein. For example, the memory system 420 may include a signaling transmitter 425, a signaling receiver 430, an information communication component 435, a storing component 440, a configuration procedure initiation component 445, a parameter value identification component 450, or any combination thereof. Each of these components may communicate, directly or indirectly, with one another (e.g., via one or more buses).

The signaling transmitter 425 may be configured as or otherwise support a means for transmitting, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device. The signaling receiver 430 may be configured as or otherwise support a means for receiving, from the host system, additional signaling associated with the first set of values for the set of parameters for the second channel based at least in part on transmitting the signaling indicative of the first set of values. The information communication component 435 may be configured as or otherwise support a means for communicating the information over the second channel based at least in part on receiving the additional signaling.

In some examples, the storing component 440 may be configured as or otherwise support a means for storing the first set of values in a serial presence detect memory device of the memory system, where transmitting the signaling indicative of the first set of values is based at least in part on storing the first set of values in the serial presence detect memory device.

In some examples, the configuration procedure initiation component 445 may be configured as or otherwise support a means for initiating a configuration procedure associated with powering the memory system, where the transmitting the signaling indicative of the first set of values is based at least in part on initiating the configuration procedure.

In some examples, to support receiving the additional signaling, the signaling receiver 430 may be configured as or otherwise support a means for receiving a second set of values for the set of parameters for the second channel based at least in part on transmitting the signaling indicative of the first set of values, where communicating the information over the second channel is based at least in part on the second set of values.

In some examples, at least one of the first set of values is different than the second set of values.

In some examples, to support receiving the additional signaling, the signaling receiver 430 may be configured as or otherwise support a means for receiving an acknowledgement to use the first set of values for the set of parameters for the second channel based at least in part on transmitting the signaling indicative of the first set of values, where communicating the information over the second channel is based at least in part on the first set of values.

In some examples, to support receiving the additional signaling, the signaling receiver 430 may be configured as or otherwise support a means for receiving a command to perform a training operation on the second channel to identify a second set of values for the set of parameters. In some examples, to support receiving the additional signaling, the parameter value identification component 450 may be configured as or otherwise support a means for identifying the second set of values for the set of parameters of the second channel between the storage device and the memory device based at least in part on performing the training operation, where communicating the information over the second channel is based at least in part on the second set of values.

In some examples, the signaling receiver 430 may be configured as or otherwise support a means for receiving a second command to perform a second training operation on the first channel to identify a set of values for a second set of parameters for the first channel, where the second training operation for the first channel is different than the training operation for the second channel.

In some examples, the first set of values are used as starting values for the training operation of the second channel.

In some examples, the memory system includes a dual inline memory module. In some examples, the memory device includes a volatile memory device of the dual inline memory module. In some examples, the storage device includes a buffer or a register or both.

In some examples, the set of parameters includes a gain associated with decision feedback equalization of the second channel, an indication of whether one or more taps of the decision feedback equalization of the second channel are enabled, an indication of whether the decision feedback equalization for the second channel is enabled, a reference voltage of the second channel, an adjustment parameter for the reference voltage of the second channel, an indication of whether on-die termination of the second channel is enabled, an indication of whether duty cycle adjusting for the second channel is enabled, a duty-cycle adjustment parameter associated with one or more clock signals, or any combination thereof.

In some examples, the second channel includes a command/address pin and a data pin. In some examples, a first portion of the storage device coupled with the command/address pin includes a register. In some examples, a second portion of the storage device coupled with the data pin includes a buffer.

Figure 5:
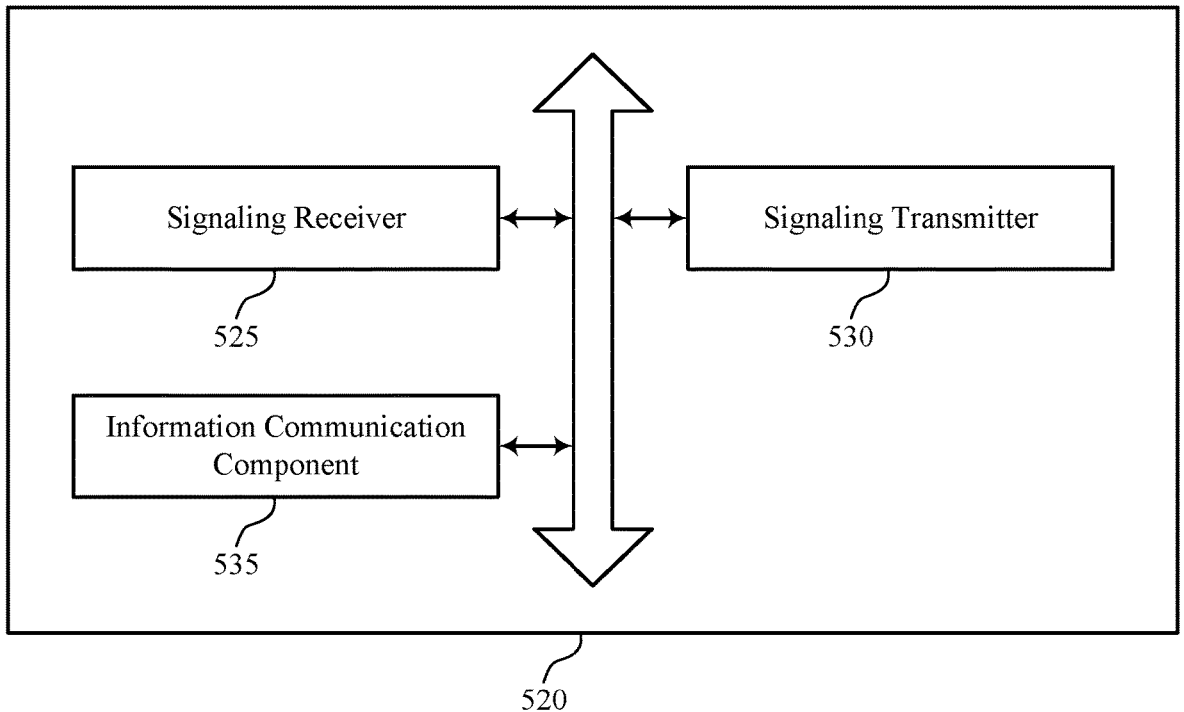
FIG. 5 shows a block diagram of a host system that supports initializing memory systems in accordance with examples as disclosed herein.

FIG. 5 shows a block diagram 500 of a host system 520 that supports initializing memory systems in accordance with examples as disclosed herein. The host system 520 may be an example of aspects of a host system as described with reference to FIGS. 1 through 3. The host system 520, or various components thereof, may be an example of means for performing various aspects of initializing memory systems as described herein. For example, the host system 520 may include a signaling receiver 525, a signaling transmitter 530, an information communication component 535, or any combination thereof. Each of these components may communicate, directly or indirectly, with one another (e.g., via one or more buses).

The signaling receiver 525 may be configured as or otherwise support a means for receiving, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device. The signaling transmitter 530 may be configured as or otherwise support a means for transmitting, to the memory system, additional signaling associated with the first set of values for the set of parameters for the second channel based at least in part on receiving the signaling indicative of the first set of values. The information communication component 535 may be configured as or otherwise support a means for communicating the information over the second channel based at least in part on transmitting the additional signaling.

In some examples, to support receiving the signaling indicative of the first set of values, the signaling receiver 525 may be configured as or otherwise support a means for receiving the signaling indicative of the first set of values from a serial presence detect memory device of the memory system.

In some examples, to support transmitting the additional signaling, the signaling transmitter 530 may be configured as or otherwise support a means for transmitting a second set of values for the set of parameters for the second channel based at least in part on receiving the signaling indicative of the first set of values, where communicating the information over the second channel is based at least in part on the second set of values.

In some examples, at least one of the first set of values is different than the second set of values.

In some examples, to support transmitting the additional signaling, the signaling transmitter 530 may be configured as or otherwise support a means for transmitting an acknowledgement to use the first set of values for the set of parameters for the second channel based at least in part on receiving the signaling of the first set of values, where communicating the information over the second channel is based at least in part on the first set of values.

In some examples, to support transmitting the additional signaling, the signaling transmitter 530 may be configured as or otherwise support a means for transmitting a command to perform a training operation on the second channel to identify a second set of values for the set of parameters, where communicating the information over the second channel is based at least in part on transmitting the command.

In some examples, the signaling transmitter 530 may be configured as or otherwise support a means for transmitting a second command to perform a second training operation on the first channel to identify a set of values for a second set of parameters for the first channel, where the second training operation for the first channel is different than the training operation for the second channel.

In some examples, the first set of values are associated with starting values for the training operation on the first channel.

In some examples, the set of parameters includes a gain associated with decision feedback equalization of the second channel, an indication of whether one or more taps of the decision feedback equalization of the second channel are enabled, an indication of whether the decision feedback equalization for the second channel is enabled, a reference voltage of the second channel, an adjustment parameter for the reference voltage of the second channel, an indication of whether on-die termination of the second channel is enabled, an indication of whether duty cycle adjusting for the second channel is enabled, a duty-cycle adjustment parameter associated with one or more clock signals, or any combination thereof.

Figure 6:
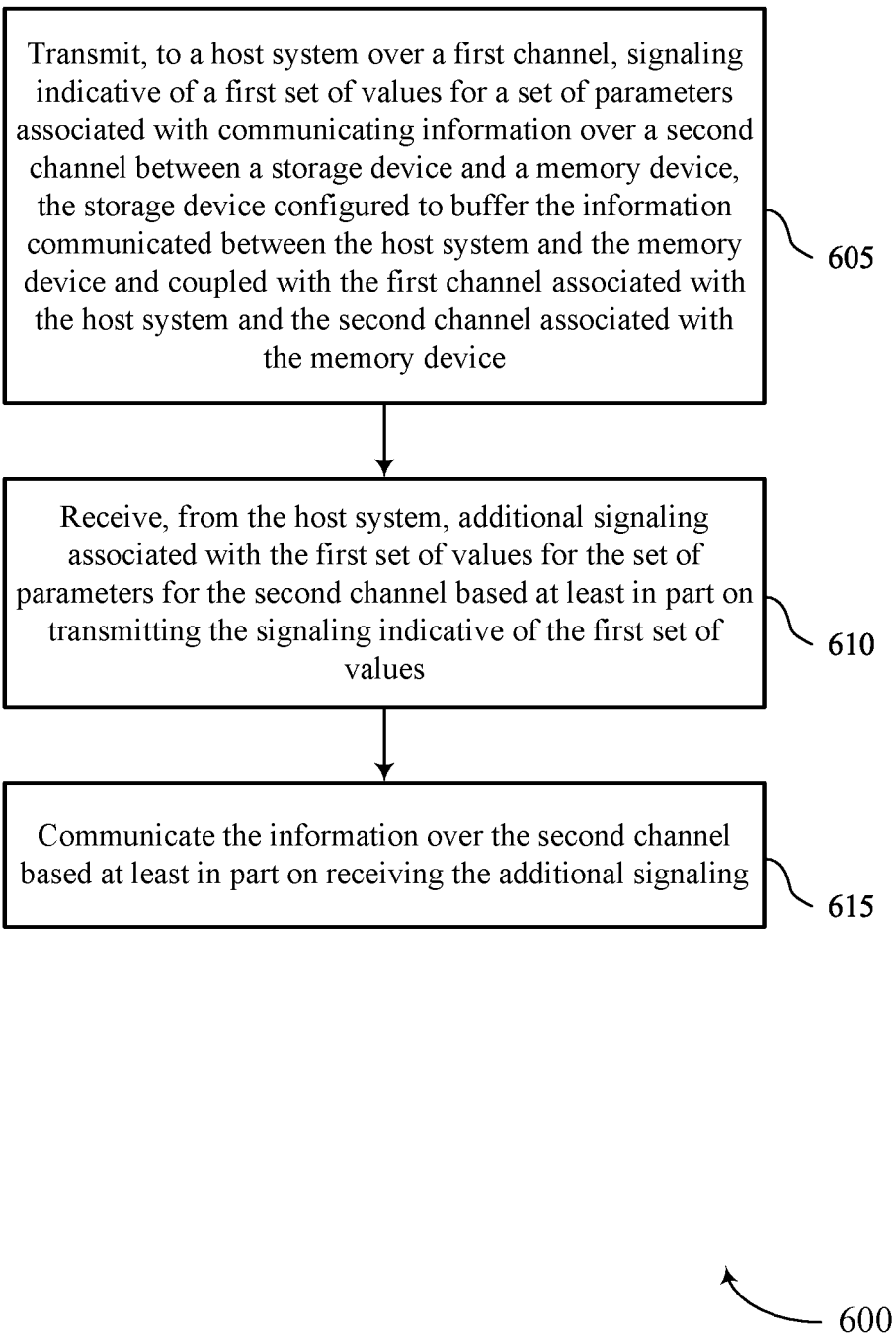
FIGS. 6 and 7 show flowcharts illustrating a method or methods that support initializing memory systems in accordance with examples as disclosed herein.

FIG. 6 shows a flowchart illustrating a method 600 that supports initializing memory systems in accordance with examples as disclosed herein. The operations of method 600 may be implemented by a memory system or its components as described herein. For example, the operations of method 600 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 605, the method may include transmitting, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device. The operations of 605 may be performed in accordance with examples as disclosed herein. In some examples, aspects of the operations of 605 may be performed by a signaling transmitter 425 as described with reference to FIG. 4.

At 610, the method may include receiving, from the host system, additional signaling associated with the first set of values for the set of parameters for the second channel based at least in part on transmitting the signaling indicative of the first set of values. The operations of 610 may be performed in accordance with examples as disclosed herein. In some examples, aspects of the operations of 610 may be performed by a signaling receiver 430 as described with reference to FIG. 4.

At 615, the method may include communicating the information over the second channel based at least in part on receiving the additional signaling. The operations of 615 may be performed in accordance with examples as disclosed herein. In some examples, aspects of the operations of 615 may be performed by an information communication component 435 as described with reference to FIG. 4.

In some examples, an apparatus as described herein may perform a method or methods, such as the method 600. The apparatus may include, features, circuitry, logic, means, or instructions (e.g., a non-transitory computer-readable medium storing instructions executable by a processor) for transmitting, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, receiving, from the host system, additional signaling associated with the first set of values for the set of parameters for the second channel based at least in part on transmitting the signaling indicative of the first set of values, and communicating the information over the second channel based at least in part on receiving the additional signaling.

Some examples of the method 600 and the apparatus described herein may further include operations, features, circuitry, logic, means, or instructions for storing the first set of values in a serial presence detect memory device of the memory system, where transmitting the signaling indicative of the first set of values may be based at least in part on storing the first set of values in the serial presence detect memory device.

Some examples of the method 600 and the apparatus described herein may further include operations, features, circuitry, logic, means, or instructions for initiating a configuration procedure associated with powering the memory system, where the transmitting the signaling indicative of the first set of values may be based at least in part on initiating the configuration procedure.

In some examples of the method 600 and the apparatus described herein, receiving the additional signaling may include operations, features, circuitry, logic, means, or instructions for receiving a second set of values for the set of parameters for the second channel based at least in part on transmitting the signaling indicative of the first set of values, where communicating the information over the second channel may be based at least in part on the second set of values.

In some examples of the method 600 and the apparatus described herein, at least one of the first set of values may be different than the second set of values.

In some examples of the method 600 and the apparatus described herein, receiving the additional signaling may include operations, features, circuitry, logic, means, or instructions for receiving an acknowledgement to use the first set of values for the set of parameters for the second channel based at least in part on transmitting the signaling indicative of the first set of values, where communicating the information over the second channel may be based at least in part on the first set of values.

In some examples of the method 600 and the apparatus described herein, receiving the additional signaling may include operations, features, circuitry, logic, means, or instructions for receiving a command to perform a training operation on the second channel to identify a second set of values for the set of parameters and identifying the second set of values for the set of parameters of the second channel between the storage device and the memory device based at least in part on performing the training operation, where communicating the information over the second channel may be based at least in part on the second set of values.

Some examples of the method 600 and the apparatus described herein may further include operations, features, circuitry, logic, means, or instructions for receiving a second command to perform a second training operation on the first channel to identify a set of values for a second set of parameters for the first channel, where the second training operation for the first channel may be different than the training operation for the second channel.

In some examples of the method 600 and the apparatus described herein, the first set of values may be used as starting values for the training operation of the second channel.

In some examples of the method 600 and the apparatus described herein, the memory system includes a dual inline memory module, the memory device includes a volatile memory device of the dual inline memory module, and the storage device includes a buffer or a register or both.

In some examples of the method 600 and the apparatus described herein, the set of parameters includes a gain associated with decision feedback equalization of the second channel, an indication of whether one or more taps of the decision feedback equalization of the second channel may be enabled, an indication of whether the decision feedback equalization for the second channel may be enabled, a reference voltage of the second channel, an adjustment parameter for the reference voltage of the second channel, an indication of whether on-die termination of the second channel may be enabled, an indication of whether duty cycle adjusting for the second channel may be enabled, a duty-cycle adjustment parameter associated with one or more clock signals, or any combination thereof.

In some examples of the method 600 and the apparatus described herein, the second channel includes a command/address pin and a data pin, a first portion of the storage device coupled with the command/address pin includes a register, and a second portion of the storage device coupled with the data pin includes a buffer.

Figure 7:
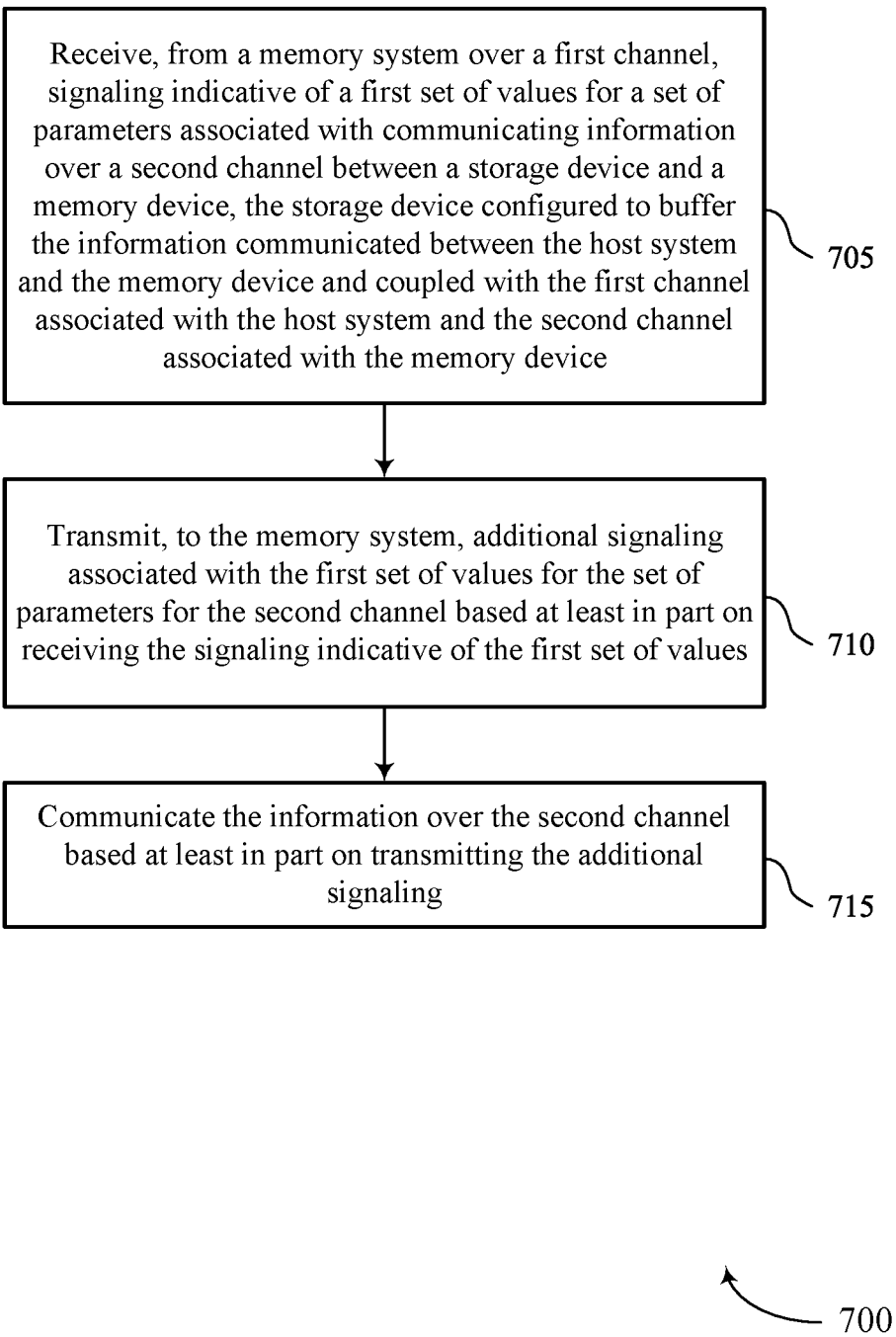

FIG. 7 shows a flowchart illustrating a method 700 that supports initializing memory systems in accordance with examples as disclosed herein. The operations of method 700 may be implemented by a host system or its components as described herein. For example, the operations of method 700 may be performed by a host system as described with reference to FIGS. 1 through 3 and 5. In some examples, a host system may execute a set of instructions to control the functional elements of the device to perform the described functions. Additionally or alternatively, the host system may perform aspects of the described functions using special-purpose hardware.

At 705, the method may include receiving, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device. The operations of 705 may be performed in accordance with examples as disclosed herein. In some examples, aspects of the operations of 705 may be performed by a signaling receiver 525 as described with reference to FIG. 5.

At 710, the method may include transmitting, to the memory system, additional signaling associated with the first set of values for the set of parameters for the second channel based at least in part on receiving the signaling indicative of the first set of values. The operations of 710 may be performed in accordance with examples as disclosed herein. In some examples, aspects of the operations of 710 may be performed by a signaling transmitter 530 as described with reference to FIG. 5.

At 715, the method may include communicating the information over the second channel based at least in part on transmitting the additional signaling. The operations of 715 may be performed in accordance with examples as disclosed herein. In some examples, aspects of the operations of 715 may be performed by an information communication component 535 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, transmitting, to the memory system, additional signaling associated with the first set of values for the set of parameters for the second channel based at least in part on receiving the signaling indicative of the first set of values, and communicating the information over the second channel based at least in part on transmitting the additional signaling.

In some examples of the method 700 and the apparatus described herein, receiving the signaling indicative of the first set of values may include operations, features, circuitry, logic, means, or instructions for receiving the signaling indicative of the first set of values from a serial presence detect memory device of the memory system.

In some examples of the method 700 and the apparatus described herein, transmitting the additional signaling may include operations, features, circuitry, logic, means, or instructions for transmitting a second set of values for the set of parameters for the second channel based at least in part on receiving the signaling indicative of the first set of values, where communicating the information over the second channel may be based at least in part on the second set of values.

In some examples of the method 700 and the apparatus described herein, at least one of the first set of values may be different than the second set of values.

In some examples of the method 700 and the apparatus described herein, transmitting the additional signaling may include operations, features, circuitry, logic, means, or instructions for transmitting an acknowledgement to use the first set of values for the set of parameters for the second channel based at least in part on receiving the signaling of the first set of values, where communicating the information over the second channel may be based at least in part on the first set of values.

In some examples of the method 700 and the apparatus described herein, transmitting the additional signaling may include operations, features, circuitry, logic, means, or instructions for transmitting a command to perform a training operation on the second channel to identify a second set of values for the set of parameters, where communicating the information over the second channel may be based at least in part on transmitting the command.

Some examples of the method 700 and the apparatus described herein may further include operations, features, circuitry, logic, means, or instructions for transmitting a second command to perform a second training operation on the first channel to identify a set of values for a second set of parameters for the first channel, where the second training operation for the first channel may be different than the training operation for the second channel.

In some examples of the method 700 and the apparatus described herein, the first set of values may be associated with starting values for the training operation on the first channel.

In some examples of the method 700 and the apparatus described herein, the set of parameters includes a gain associated with decision feedback equalization of the second channel, an indication of whether one or more taps of the decision feedback equalization of the second channel may be enabled, an indication of whether the decision feedback equalization for the second channel may be enabled, a reference voltage of the second channel, an adjustment parameter for the reference voltage of the second channel, an indication of whether on-die termination of the second channel may be enabled, an indication of whether duty cycle adjusting for the second channel may be enabled, a duty-cycle adjustment parameter associated with one or more clock signals, or any combination thereof.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory system and logic associated with the memory system, where the logic is configured to cause the apparatus to: transmit, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, receive, from the host system, additional signaling associated with the first set of values for the set of parameters for the second channel based at least in part on transmitting the signaling indicative of the first set of values, and communicate the information over the second channel based at least in part on receiving the additional signaling.

In some examples, the logic may be further configured to store the first set of values in a serial presence detect memory device of the memory system, where transmitting the signaling indicative of the first set of values may be based at least in part on storing the first set of values in the serial presence detect memory device.

In some examples, the logic may be further configured to initiate a configuration procedure associated with powering the memory system, where the transmitting the signaling indicative of the first set of values may be based at least in part on initiating the configuration procedure.

In some examples, the logic being configured to receive the additional signaling may include the logic being configured to receive a second set of values for the set of parameters for the second channel based at least in part on transmitting the signaling indicative of the first set of values, where communicating the information over the second channel may be based at least in part on the second set of values, where at least one of the first set of values may be different than the second set of values.

In some examples, the logic being configured to receive the additional signaling may include the logic being configured to receive an acknowledgement to use the first set of values for the set of parameters for the second channel based at least in part on transmitting the signaling indicative of the first set of values, where communicating the information over the second channel may be based at least in part on the first set of values.

In some examples, the logic being configured to receive the additional signaling may include the logic being configured to receive a command to perform a training operation on the second channel to identify a second set of values for the set of parameters and identify the second set of values for the set of parameters of the second channel between the storage device and the memory device based at least in part on performing the training operation, where communicating the information over the second channel may be based at least in part on the second set of values.

In some examples, the logic may be further configured to receive a second command to perform a second training operation on the first channel to identify a set of values for a second set of parameters for the first channel, where the second training operation for the first channel may be different than the training operation for the second channel, where the first set of values may be used as starting values for the training operation of the second channel.

In some examples of the apparatus, the set of parameters includes a gain associated with decision feedback equalization of the second channel, an indication of whether one or more taps of the decision feedback equalization of the second channel may be enabled, an indication of whether the decision feedback equalization for the second channel may be enabled, a reference voltage of the second channel, an adjustment parameter for the reference voltage of the second channel, an indication of whether on-die termination of the second channel may be enabled, an indication of whether duty cycle adjusting for the second channel may be enabled, a duty-cycle adjustment parameter associated with one or more clock signals, or any combination thereof.

Another apparatus is described. The apparatus may include logic configured to cause the apparatus to: receive, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, transmit, to the memory system, additional signaling associated with the first set of values for the set of parameters for the second channel based at least in part on receiving the signaling indicative of the first set of values, and communicate the information over the second channel based at least in part on transmitting the additional signaling.

In some examples, the logic being configured to receive the signaling indicative of the first set of values may include the logic being configured to include receive the signaling indicative of the first set of values from a serial presence detect memory device of the memory system.

In some examples, the logic being configured to transmit the additional signaling may include the logic being configured to transmit a second set of values for the set of parameters for the second channel based at least in part on receiving the signaling indicative of the first set of values, where communicating the information over the second channel may be based at least in part on the second set of values, where at least one of the first set of values may be different than the second set of values.

In some examples, the logic being configured to transmit the additional signaling may include the logic being configured to transmit an acknowledgement to use the first set of values for the set of parameters for the second channel based at least in part on receiving the signaling indicative of the first set of values, where communicating the information over the second channel may be based at least in part on the first set of values.

In some examples, the logic being configured to transmit the additional signaling may include the logic being configured to transmit a command to perform a training operation on the second channel to identify a second set of values for the set of parameters, where communicating the information over the second channel may be based at least in part on transmitting the command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method at a memory system, comprising:
transmitting, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, the first set of values being associated with a training operation performed at the memory system on the second channel prior to the memory system being coupled with the host system;
receiving, from the host system, additional signaling associated with the first set of values for the set of parameters for the second channel based at least in part on transmitting the signaling indicative of the first set of values; and
communicating the information over the second channel based at least in part on receiving the additional signaling;
wherein the set of parameters comprises parameters associated with decision feedback equalization of the second channel.

2. The method of claim 1, further comprising:
storing the first set of values in a serial presence detect memory device of the memory system, wherein transmitting the signaling indicative of the first set of values is based at least in part on storing the first set of values in the serial presence detect memory device.

3. The method of claim 1, further comprising:
initiating a configuration procedure associated with powering the memory system, wherein the transmitting the signaling indicative of the first set of values is based at least in part on initiating the configuration procedure.

4. The method of claim 1, wherein receiving the additional signaling further comprises:
receiving a second set of values for the set of parameters for the second channel based at least in part on transmitting the signaling indicative of the first set of values, wherein communicating the information over the second channel is based at least in part on the second set of values.

5. The method of claim 4, wherein at least one of the first set of values is different than the second set of values.

6. The method of claim 1, wherein receiving the additional signaling further comprises:
receiving an acknowledgement to use the first set of values for the set of parameters for the second channel based at least in part on transmitting the signaling indicative of the first set of values, wherein communicating the information over the second channel is based at least in part on the first set of values.

7. The method of claim 1, wherein receiving the additional signaling further comprises:
receiving a command to perform a second training operation on the second channel to identify a second set of values for the set of parameters; and
identifying the second set of values for the set of parameters of the second channel between the storage device and the memory device based at least in part on performing the second training operation, wherein communicating the information over the second channel is based at least in part on the second set of values.

8. The method of claim 7, further comprising:
receiving a second command to perform a third training operation on the first channel to identify a set of values for a second set of parameters for the first channel, wherein the third training operation for the first channel is different than the second training operation for the second channel.

9. The method of claim 7, wherein the first set of values are used as starting values for the second training operation of the second channel.

10. The method of claim 1, wherein:
the memory system comprises a dual inline memory module;
the memory device comprises a volatile memory device of the dual inline memory module; and
the storage device comprises a buffer or a register or both.

11. The method of claim 1, wherein the set of parameters comprises a gain associated with decision feedback equalization of the second channel, an indication of whether one or more taps of the decision feedback equalization of the second channel are enabled, an indication of whether the decision feedback equalization for the second channel is enabled, a reference voltage of the second channel, an adjustment parameter for the reference voltage of the second channel, an indication of whether on-die termination of the second channel is enabled, an indication of whether duty cycle adjusting for the second channel is enabled, a duty-cycle adjustment parameter associated with one or more clock signals, or any combination thereof.

12. The method of claim 1, wherein:
the second channel comprises a command/address pin and a data pin;
a first portion of the storage device coupled with the command/address pin comprises a register; and
a second portion of the storage device coupled with the data pin comprises a buffer.

13. A non-transitory computer-readable medium storing code comprising instructions which, when executed by a processing circuitry of an electronic device, cause the electronic device to:
transmit, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, the first set of values being associated with a training operation performed at a memory system on the second channel prior to the electronic device being coupled with the host system;
receive, from the host system, additional signaling associated with the first set of values for the set of parameters for the second channel based at least in part on transmitting the signaling indicative of the first set of values; and
communicate the information over the second channel based at least in part on receiving the additional signaling;
wherein the set of parameters comprises parameters associated with decision feedback equalization of the second channel.

14. A memory system, comprising:
one or more memory devices; and
processing circuitry coupled with the one or more memory devices and configured to cause the memory system to:
transmit, to a host system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, the first set of values being associated with a training operation performed at the memory system on the second channel prior to the memory system being coupled with the host system;
receive, from the host system, additional signaling associated with the first set of values for the set of parameters for the second channel based at least in part on transmitting the signaling indicative of the first set of values; and
communicate the information over the second channel based at least in part on receiving the additional signaling;
wherein the set of parameters comprises parameters associated with decision feedback equalization of the second channel.

15. The memory system of claim 14, wherein the processing circuitry is further configured to cause the memory system to:
store the first set of values in a serial presence detect memory device of the memory system, wherein transmitting the signaling indicative of the first set of values is based at least in part on storing the first set of values in the serial presence detect memory device.

16. The memory system of claim 14, wherein the processing circuitry is further configured to cause the memory system to:
initiate a configuration procedure associated with powering the memory system, wherein the transmitting the signaling indicative of the first set of values is based at least in part on initiating the configuration procedure.

17. The memory system of claim 14, wherein the processing circuitry being configured to receive the additional signaling comprises the processing circuitry being configured to cause the memory system to:
receive a second set of values for the set of parameters for the second channel based at least in part on transmitting the signaling indicative of the first set of values, wherein communicating the information over the second channel is based at least in part on the second set of values, wherein at least one of the first set of values is different than the second set of values.

18. The memory system of claim 14, wherein the processing circuitry being configured to receive the additional signaling comprises the processing circuitry being configured to cause the memory system to:
receive an acknowledgement to use the first set of values for the set of parameters for the second channel based at least in part on transmitting the signaling indicative of the first set of values, wherein communicating the information over the second channel is based at least in part on the first set of values.

19. The memory system of claim 14, wherein the processing circuitry being configured to receive the additional signaling comprises the processing circuitry being configured to cause the memory system to:
receive a command to perform a second training operation on the second channel to identify a second set of values for the set of parameters; and
identify the second set of values for the set of parameters of the second channel between the storage device and the memory device based at least in part on performing the second training operation, wherein communicating the information over the second channel is based at least in part on the second set of values.

20. The memory system of claim 19, wherein the processing circuitry is further configured to cause the memory system to:
receive a second command to perform a third training operation on the first channel to identify a set of values for a second set of parameters for the first channel, wherein the third training operation for the first channel is different than the second training operation for the second channel, wherein the first set of values are used as starting values for the second training operation of the second channel.

21. The memory system of claim 14, wherein the set of parameters comprises a gain associated with decision feedback equalization of the second channel, an indication of whether one or more taps of the decision feedback equalization of the second channel are enabled, an indication of whether the decision feedback equalization for the second channel is enabled, a reference voltage of the second channel, an adjustment parameter for the reference voltage of the second channel, an indication of whether on-die termination of the second channel is enabled, an indication of whether duty cycle adjusting for the second channel is enabled, a duty-cycle adjustment parameter associated with one or more clock signals, or any combination thereof.

22. A method at a host system, comprising:
receiving, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, the first set of values being associated with a first training operation performed by the memory system on the second channel prior to being coupled with the host system, and the first set of values having been stored in the memory system prior to the memory system being coupled with the host system;
transmitting, to the memory system, additional signaling associated with the first set of values for the set of parameters for the second channel based at least in part on receiving the signaling indicative of the first set of values; and
communicating the information over the second channel based at least in part on transmitting the additional signaling;
wherein the set of parameters comprises parameters associated with decision feedback equalization of the second channel.

23. The method of claim 22, wherein receiving the signaling indicative of the first set of values comprises:
receiving the signaling indicative of the first set of values from a serial presence detect memory device of the memory system.

24. The method of claim 22, wherein transmitting the additional signaling further comprises:
transmitting a second set of values for the set of parameters for the second channel based at least in part on receiving the signaling indicative of the first set of values, wherein communicating the information over the second channel is based at least in part on the second set of values.

25. The method of claim 24, wherein at least one of the first set of values is different than the second set of values.

26. The method of claim 22, wherein transmitting the additional signaling further comprises:
transmitting an acknowledgement to use the first set of values for the set of parameters for the second channel based at least in part on receiving the signaling of the first set of values, wherein communicating the information over the second channel is based at least in part on the first set of values.

27. The method of claim 22, wherein transmitting the additional signaling further comprises:
transmitting a command to perform a second training operation on the second channel to identify a second set of values for the set of parameters, wherein communicating the information over the second channel is based at least in part on transmitting the command.

28. The method of claim 27, further comprising:
transmitting a second command to perform a third training operation on the first channel to identify a set of values for a second set of parameters for the first channel, wherein the third training operation for the first channel is different than the second training operation for the second channel.

29. The method of claim 27, wherein the first set of values are associated with starting values for the second training operation on the second channel.

30. The method of claim 27, wherein the set of parameters comprises a gain associated with decision feedback equalization of the second channel, an indication of whether one or more taps of the decision feedback equalization of the second channel are enabled, an indication of whether the decision feedback equalization for the second channel is enabled, a reference voltage of the second channel, an adjustment parameter for the reference voltage of the second channel, an indication of whether on-die termination of the second channel is enabled, an indication of whether duty cycle adjusting for the second channel is enabled, a duty-cycle adjustment parameter associated with one or more clock signals, or any combination thereof.

31. A host system, comprising:
processing circuitry configured to cause the host system to:
receive, from a memory system over a first channel, signaling indicative of a first set of values for a set of parameters associated with communicating information over a second channel between a storage device and a memory device, the storage device configured to buffer the information communicated between the host system and the memory device and coupled with the first channel associated with the host system and the second channel associated with the memory device, the first set of values being associated with a first training operation performed by the memory system on the second channel prior to being coupled with the host system, and the first set of values having been stored in the memory system prior to the memory system being coupled with the host system;

transmit, to the memory system, additional signaling associated with the first set of values for the set of parameters for the second channel based at least in part on receiving the signaling indicative of the first set of values; and communicate the information over the second channel based at least in part on transmitting the additional signaling;

wherein the set of parameters comprises parameters associated with decision feedback equalization of the second channel.

32. The host system of claim 31, wherein the processing circuitry configured to receive the signaling indicative of the first set of values comprises the processing circuitry being configured to cause the host system to:

receive the signaling indicative of the first set of values from a serial presence detect memory device of the memory system.

33. The host system of claim 31, wherein the processing circuitry configured to transmit the additional signaling comprises the processing circuitry being configured to cause the host system to:

transmit a second set of values for the set of parameters for the second channel based at least in part on receiving the signaling indicative of the first set of values, wherein communicating the information over the second channel is based at least in part on the second set of values, wherein at least one of the first set of values is different than the second set of values.

34. The host system of claim 31, wherein the processing circuitry configured to transmit the additional signaling comprises the processing circuitry being configured to cause the host system to:

transmit an acknowledgement to use the first set of values for the set of parameters for the second channel based at least in part on receiving the signaling indicative of the first set of values, wherein communicating the information over the second channel is based at least in part on the first set of values.

35. The host system of claim 31, wherein the processing circuitry configured to transmit the additional signaling comprises the processing circuitry being configured to cause the host system to:

transmit a command to perform a second training operation on the second channel to identify a second set of values for the set of parameters, wherein communicating the information over the second channel is based at least in part on transmitting the command.

* * * * *